(12) United States Patent
Kim et al.

(10) Patent No.: US 8,173,723 B2
(45) Date of Patent: May 8, 2012

(54) EMI/RFI SHIELDING RESIN COMPOSITE MATERIAL AND MOLDED PRODUCT MADE USING THE SAME

(75) Inventors: Sung-Jun Kim, Anyang-si (KR); Chang-Min Hong, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 134 days.

(21) Appl. No.: 12/621,580

(22) Filed: Nov. 19, 2009

(65) Prior Publication Data

US 2010/0140534 A1    Jun. 10, 2010

(30) Foreign Application Priority Data

Dec. 10, 2008    (KR) .................. 10-2008-0125378

(51) Int. Cl.
*G21F 1/10*    (2006.01)
(52) U.S. Cl. ........ 523/137; 524/439; 524/494; 524/495; 524/496
(58) Field of Classification Search .............. 523/137; 524/439, 495, 496
See application file for complete search history.

(56) References Cited

U.S. PATENT DOCUMENTS

| | | | |
|---|---|---|---|
| 4,610,808 A | 9/1986 | Kleiner | |
| 4,882,227 A | 11/1989 | Iwase et al. | |
| 5,183,594 A | 2/1993 | Yoshinaka et al. | |
| 5,869,412 A | 2/1999 | Yenni, Jr. et al. | |
| 6,048,919 A | 4/2000 | McCullough | |
| 6,251,978 B1 | 6/2001 | McCullough | |
| 6,409,942 B1 | 6/2002 | Narkis et al. | |
| 6,573,322 B1 | 6/2003 | Sakakibara et al. | |
| 6,638,448 B2 | 10/2003 | Karttunen et al. | |
| 7,063,809 B2 | 6/2006 | Tabushi et al. | |
| 7,148,281 B2 * | 12/2006 | Vilkman et al. ............... 524/440 |
| 7,348,370 B2 | 3/2008 | Bhaatia | |
| 2002/0108699 A1 | 8/2002 | Cofer et al. | |
| 2005/0277349 A1 | 12/2005 | Smith et al. | |
| 2006/0247335 A1 | 11/2006 | Bhaatia | |
| 2007/0056769 A1 | 3/2007 | Severance et al. | |
| 2007/0199738 A1 | 8/2007 | Gabower | |
| 2010/0140531 A1 | 6/2010 | Prat et al. | |
| 2010/0140565 A1 | 6/2010 | Kim et al. | |
| 2011/0135921 A1 * | 6/2011 | Tse et al. ................ 428/355 AC |

FOREIGN PATENT DOCUMENTS

| | | |
|---|---|---|
| EP | 0942436 A1 | 9/1999 |
| JP | 08-019257 | 8/1988 |
| JP | 01-213365 A | 8/1989 |
| JP | 03-138808 | 6/1991 |
| JP | 09-241420 | 9/1997 |
| JP | 2000-086886 A | 3/2000 |
| JP | 2000-129148 | 5/2000 |
| JP | 2000-348739 A | 12/2000 |
| JP | 2006-022130 | 1/2006 |
| JP | 2006-022130 A | 1/2006 |
| JP | 2006-126177 A | 5/2006 |
| JP | 2006-257174 A | 9/2006 |
| JP | 2006-328155 A2 | 12/2006 |
| JP | 2006-328352 | 12/2006 |
| JP | 2006-328352 A | 12/2006 |
| JP | 2008-504378 A | 2/2008 |
| JP | 2008-179834 A | 8/2008 |
| WO | 2009/054567 A1 | 4/2009 |
| WO | 2010/053226 A1 | 5/2010 |

OTHER PUBLICATIONS

International Search Report in commonly owned International Application No. PCT/KR2007/007010, dated Jun. 30, 2008, pp. 1-2.
Office Action in commonly owned U.S. Appl. No. 12/764,305 mailed May 19, 2011, pp. 1-15.
Derwent Abstract of JP 03138808 A (Acc. No. 1991-218068, 2 pages), 1991.
Machine translated English equivalent of JP 2000-086886, 4 pages, 2000.
Alloy Digest (Data on World Wide Metals and Alloys, ASM International, pp. 2678-2679), 1973.
Lewis (Hawley's Condensed Chemical Dictionary, 2007, John Wiley & Sons, Inc. pp. 914-915).
MFT (Metal Flake Technologies, MW Milling, Premium Zinc Flake Z45).

\* cited by examiner

*Primary Examiner* — Peter Szekely
(74) *Attorney, Agent, or Firm* — Summa, Additon & Ashe, P.A.

(57) ABSTRACT

Disclosed is an electromagnetic wave EMI/RFI shielding resin composite material that includes a thermoplastic polymer resin, an electrically conductive filler having a polyhedral shape or being capable of forming a polyhedral shape, and a low-melting point metal, and a molded product made using the EMI/RFI shielding resin composite material.

13 Claims, 3 Drawing Sheets

EMI/RFI SHIELDING RESIN COMPOSITE MATERIAL AND MOLDED PRODUCT MADE USING THE SAME

RELATED APPLICATIONS

This application claims priority to and the benefit of Korean Patent Application No. 10-2008-0125378 filed in the Korean Intellectual Property Office on Dec. 10, 2008, the entire disclosure of which is incorporated herein by reference.

FIELD OF THE INVENTION

The present invention relates to an electromagnetic wave interference (EMI)/radio frequency interference (RFI) shielding resin composite material, and a molded product made using the same.

BACKGROUND OF THE INVENTION

Electromagnetic wave generation is increased through highly efficient, high power consuming, and highly integrated electro-electronic devices. Electromagnetic waves cause malfunctions to other devices and systems or damage to the human body, so effective electromagnetic wave shield techniques are required in order to shield the electromagnetic waves.

EMI shielding effectiveness is represented by the following Equation 1.

$$S.B.(\text{shielding effectiveness}) = R + A + B \qquad \text{[Equation 1]}$$

In the above Equation 1, R represents surface reflection of an electromagnetic wave, A represents internal absorption of an electromagnetic wave, and B represents loss by multi-reflection.

The conventional method of shielding electromagnetic waves includes an applied painting and plating method using a metallic material.

Since the metallic material has high conductivity (R value, impedance is low) and a high electromagnetic wave shield rate through the surface reflection of electromagnetic waves, it is possible for even a thin metal to effectively shield electromagnetic waves.

However, the painting and plating techniques, particularly the plating process, include complicated steps such as removing oils, etching, neutralizing, activating, accelerating, metal depositing, activating, first plating, second plating, third plating, and so on. Accordingly these techniques have drawbacks such as high production costs and low productivity, particularly in view of recent demands for increased productivity.

In contrast, an electromagnetic wave shielding material using a polymer composite resin can be obtained by simply injecting a composite resin, so it is a very economical process with regard to production cost and productivity.

However, in the case of a composite material using the polymer composite resin, since the electrical conductivity is lower than that of a metallic material, it is important to improve the surface reflection and internal absorption among the factors shown in Equation 1. Accordingly, the resin composite material has the drawback of deteriorated or reduced electromagnetic wave shielding efficiency when it is too thin. In order to increase the electromagnetic wave shielding efficiency of a resin composite material, the surface impedance thereof is decreased (electrical conductivity is increased), the R value is increased, and internal electromagnetic wave scattering/absorption is further induced, so that the A value is increased to provide a highly effective electromagnetic wave shielding composite resin.

The following publications relate to shielding electromagnetic waves coming from all electronic devices such as radio frequency interference (RFI): an electromagnetic wave shielding device including a polymer substrate coated with metal on its surface (U.S. Patent Application Publication No. 2007-0199738); an electromagnetic wave shielding material including a non-conductive polymer, a conductive polymer, and an electrically conductive metal powder (U.S. Patent Application Publication No. 2007-0056769); a method of manufacturing an electrically conductive immersed fiber by coating a conductive fiber with a compatibilizer such as an organic wetting agent, and compositing the same in a resin (U.S. Patent Application Publication No. 2002-0108699); an electrically conductive thermoplastic elastomer including a conductive filler of nickel plated with silver in a styrene-ethylene-butadiene-styrene copolymer (SEBS) based matrix material which is a non-conductive resin (U.S. Pat. No. 6,638,448); an electrically conductive composition in which a carbonaceous conductive filler is immersed in a blend of two polymer resins having different polarities and the carbonaceous conductive filler is disposed on one having the higher polarity (U.S. Pat. No. 6,409,942); and a thermoplastic electromagnetic wave shielding sheet including a sheet material or polymer carrier that is capable of becoming porous during a thermoforming process and including a low-melting point metal conductive filler (U.S. Pat. No. 5,869,412).

However, these techniques provide resins with only electrical conductivity and thus do not satisfy the required electromagnetic wave shielding effects.

SUMMARY OF THE INVENTION

An exemplary aspect of the present invention provides an electromagnetic wave interference (EMI)/radio frequency interference (RFI) shielding resin composite material having high performance due to excellent electromagnetic wave shield effects.

Another aspect of the present invention provides a molded product made using the EMI/RFI shielding resin composite material.

According to one aspect of the present invention, an EMI/RFI shielding resin composite material is provided that includes (A) a thermoplastic polymer resin; (B) an electrically conductive filler having a polyhedral shape or being capable of forming a polyhedral shape; and (C) a low-melting point metal.

The EMI/RFI shielding resin composite material includes about 30 to about 85 volume % of the thermoplastic polymer resin (A); about 5 to about 69 volume % of the electrically conductive filler having a polyhedral shape or being capable of forming a polyhedral shape (B); and about 1 to about 10 volume % of the low-melting point metal (C).

The EMI/RFI shielding resin composite material may optionally further include a glass fiber filler (D) in an amount of about 50 parts by weight or less, based on about 100 parts by weight of the EMI/RFI shielding resin composite material.

The thermoplastic polymer resin (A) may include a polyamide, polyalkylene terephthalate, a polyacetal, a polycarbonate, a polyimide, a polyphenylene oxide, a polysulfone, a polyphenylene sulfide, a polyamide imide, a polyether sulfone, a liquid crystal polymer, a polyetherketone, a polyetherimide, a polyolefin, acrylonitrile-butadiene-styrene, a polystyrene, a syndiotactic polystyrene, or a combination thereof.

The electrically conductive filler (B) having a polyhedral shape or being capable of forming a polyhedral shape may be a needle-shaped electrically conductive filler having a polyhedral interior, a sheet-shaped electrically conductive filler having a polyhedral interior, a globular electrically conductive filler having a polyhedral interior, or a combination thereof. The needle-shaped electrically conductive filler having a polyhedral interior may be a metal filler fabricated in a needle shape by pressing and cutting a dendrite metal filler fabricated through an electrolysis process or a porous metal filler fabricated through a thermal process, or a needle-shaped metal filler fabricated by polishing a metal lump; the sheet-shaped electrically conductive filler having a polyhedral interior may be a metal filler fabricated in a sheet shape by pressing a dendrite metal filler fabricated through an electrolysis process or a porous metal filler fabricated through a thermal process, or a sheet-shaped metal filler fabricated through a pulverization process; and the globular electrically conductive filler having a polyhedral interior may be a globular metal filler fabricated through a melt injection process.

The electrically conductive filler (B) may be a metal conductive filler that can be broken down or pulverized by a shear stress applied during the process of producing the EMI/RFI shielding resin composite material to thereby form a polyhedral shape. Also, the electrically conductive filler (B) may have a shear strength of under about 300 MPa, and it may include aluminum, copper, magnesium, iron, nickel, molybdenum, zinc, silver, alloys thereof, or combinations thereof.

The low-melting point metal (C) may be solid solution including two or more kinds of metal elements. Also, the low-melting point metal (C) may include a primary component including tin, bismuth, lead, or a combination thereof, and a secondary component including aluminum, nickel, silver, germanium, indium, zinc, or a combination thereof. The low-melting point metal (C) may have a solidus temperature which is lower than the temperature used in the process of making the EMI/RFI shielding resin composite material.

According to another aspect of the present invention, a molded product made using the EMI/RFI shielding resin composite material is provided.

Hereinafter, further embodiments will be described in detail.

DETAILED DESCRIPTION OF THE INVENTION

Figure 1:
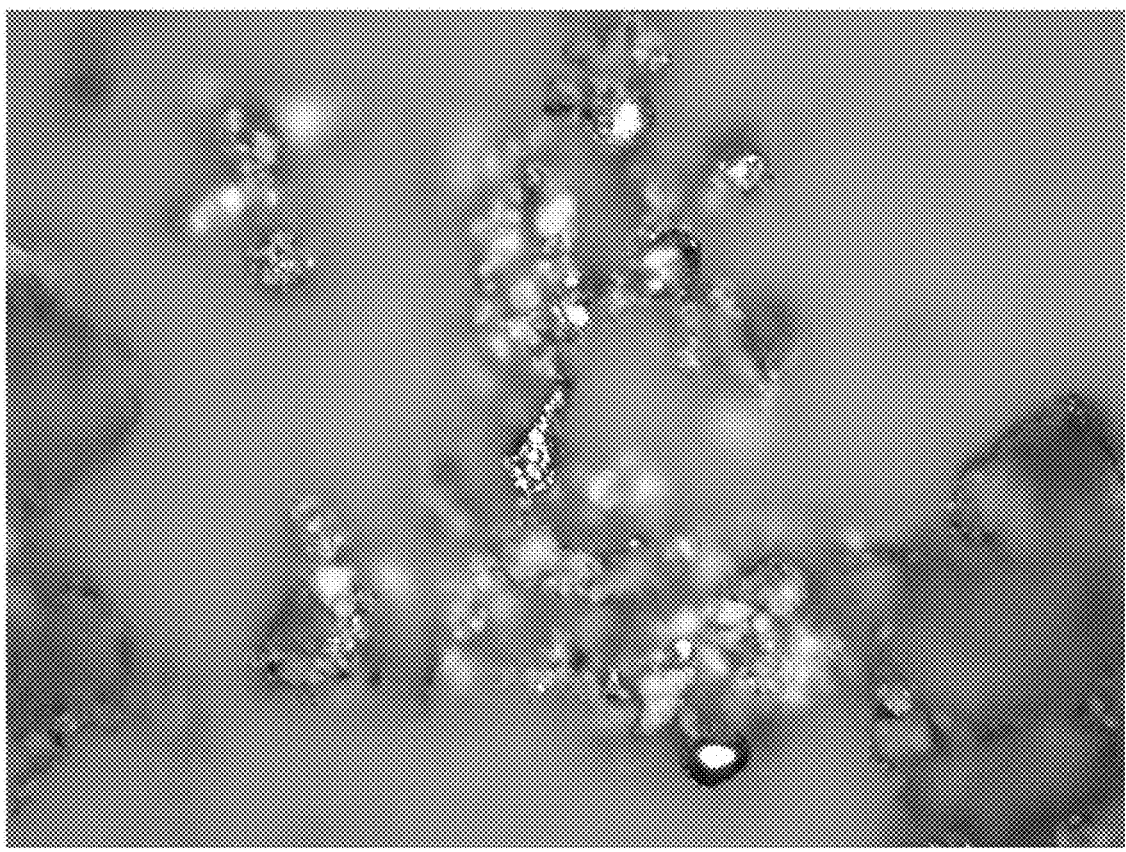
FIG. 1 is an optical microscopic photograph showing the shape of an aluminum electrically conductive filler and a low-melting point metal existing in an EMI/RFI shielding resin composite material fabricated in accordance with Example 5 exemplifying an embodiment of the present invention.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when specific definition is not provided, the term "electromagnetic wave interference (EMI)/radio frequency interference (RFI)" refers to "electromagnetic wave interference (EMI) or radio frequency interference (RFI)".

According to one embodiment, the electromagnetic wave shielding effectiveness (S.B) represented by the following Equation 1 may be improved by improving inner absorption of electromagnetic waves.

$$S.B.=R+A+B \quad \text{[Equation 1]}$$

In the above Equation, R represents surface reflection of an electromagnetic wave, A represents internal absorption of an electromagnetic wave, and B represents loss by multi-reflection.

The inventors of the present invention found that when a conductive filler is formed to have many surfaces, scattered reflection of electromagnetic waves whose characteristics are similar to light is induced and thus the amounts of scattering and absorption are increased, which leads to an increase in the A value, in the course of researching a method for increasing the A value at the same electric conductivity level.

The EMI/RFI shielding resin composite material according to one embodiment includes (A) a thermoplastic polymer resin; (B) an electrically conductive filler having a polyhedral shape or being capable of forming a polyhedral shape; and (C) a low-melting point metal.

The electromagnetic wave interference (EMI)/radio frequency interference (RFI) shielding resin composite material includes about 30 to about 85 volume % of the thermoplastic polymer resin (A); about 5 to about 69 volume % of an electrically conductive filler having a polyhedral shape or being capable of forming a polyhedral shape (B); and about 1 to about 10 volume % of the low-melting point metal (C) based on the total weight of the EMI/RFI shielding resin composite material.

The EMI/RFI shielding resin composite material according to one embodiment can be prepared by mixing the components. The EMI/RFI shielding resin composition can have a structure including a matrix of the thermoplastic polymer resin, and the electrically conductive filler having a polyhedral shape or being capable of forming a polyhedral shape and low-melting point metal dispersed in the matrix to provide a network.

Exemplary components included in the EMI/RFI shielding resin composite material according to embodiments will hereinafter be described in detail.

(A) Thermoplastic Polymer Resin

Exemplary thermoplastic polymer resins include without limitation polyamides; polyalkylene terephthalates such as polyethylene terephthalate, polybutylene terephthalate, and the like; polyacetals; polycarbonates; polyimides; polyphenylene oxides; polysulfones; polyphenylene sulfides; polyamide imides; polyether sulfones; liquid crystal polymers; polyetherketones; polyetherimides; polyolefins such as polypropylene, polyethylene, and the like; acrylonitrile-butadiene-styrene; polystyrene; syndiotactic polystyrene; and the like, and combinations and blends thereof.

The EMI/RFI shielding resin composite material may include the thermoplastic polymer resin in an amount of about 30 to about 85 volume %, and in another embodiment, about 50 to about 80 volume % based on the total amount of EMI/RFI shielding resin composite material. When the EMI/

RFI shielding resin composite material includes the thermoplastic polymer resin in an amount within these ranges, the process and the EMI shielding efficiency and processability can be improved.

(B) Electrically Conductive Filler

The electrically conductive filler according to an embodiment can minimize impedance for a network formed by a thermoplastic polymer resin dispersed in a matrix, and effectively scatter electromagnetic waves, or radio waves, by existing in a polyhedral shape before or after the fabrication process of an EMI/RFI shielding resin composite material.

The electrically conductive filler may have a polyhedral shape or may be capable of forming a polyhedral shape, and it may have a needle shape, a sheet shape, or a globular shape.

In other words, the needle-shaped electrically conductive filler may have a polyhedral needle-shaped interior, the sheet-shaped electrically conductive filler may have a polyhedral sheet-shaped interior, and the globular electrically conductive filler may have a polyhedral globular interior.

The needle-shaped electrically conductive filler having a polyhedral interior may be a metal filler fabricated in a needle shape by pressing and cutting a dendrite metal filler fabricated through an electrolysis process or a porous metal filler fabricated through a thermal process, or a needle-shaped metal filler fabricated by polishing a metal lump. The sheet-shaped electrically conductive filler having a polyhedral interior may be a metal filler fabricated in a sheet shape by pressing a dendrite metal filler fabricated through an electrolysis process or a porous metal filler fabricated through a thermal process, or a sheet-shaped metal filler fabricated through a pulverization process. The globular electrically conductive filler having a polyhedral interior may be a globular metal filler fabricated through a melt injection process.

Also, in exemplary embodiments, the electrically conductive filler may be broken down and pulverized by shear stress applied during the fabrication process of the EMI/RFI shielding resin composite material, i.e., during the process of mixing the components of the resin composite material, to thereby form a polyhedral shape.

The electrically conductive filler may have a shear strength of under about 300 MPa, for example from about 10 MPa to about 300 MPa, and as another example about 10 MPa to about 100 MPa. When the electrically conductive filler has a shear strength within the above ranges, it may be broken down and pulverized during the process used to make the composite material. When the electrically conductive filler has a shear strength of at least more than about 10 MPa, it is possible to prevent the metal filler from collapsing during the process. When the electrically conductive filler includes two or more kinds of metals, the shear strength of each metal should fall within the above ranges.

As described above, the electrically conductive filler which is formed in a polyhedral shape or is capable of forming a polyhedral shape during the process of making the EMI/RFI shielding resin composite material may include a metal such as aluminum, copper, magnesium, iron, nickel, molybdenum, zinc, silver, alloys thereof, and the like, and combinations thereof.

The EMI/RFI shielding resin composite material may include the electrically conductive filler in an amount of about 5 to about 69 volume %, for example about 20 to about 40 volume %, based on the total amount of the EMI/RFI shielding resin composite material. When the EMI/RFI shielding resin composite material includes the electrically conductive filler in an amount within these ranges, the electromagnetic wave shielding efficiency can be excellent, and an EMI/RFI shielding resin composite material may be easily fabricated using a conventional injection molding process.

(C) Low-Melting Point Metal

The low-melting point metal according to an embodiment can maximize the network formed by the thermoplastic polymer resin and the electrically conductive filler to thereby further decrease impedance. In other words, the low-melting point metal can serve as a supplementary agent for the electrically conductive filler. When the low-melting point metal is used alone without using an electrically conductive filler, it can agglomerate in the thermoplastic polymer resin, which can minimize or eliminate the shielding effect and deteriorate electrical conductivity.

The low-melting point metal is a solid solution including at least two kinds of metal elements, and includes a main component (i.e., a majority component comprising greater than 50%, for example at least about 75%, or at least about 85%, or at least about 90%, or higher, of the total weight percent of the low-melting point metal) and a minor component (i.e., a minority component comprising less than 50% of the total weight of the low-melting point metal). Exemplary main components can include without limitation tin, bismuth, lead, and the like, and combinations thereof, and exemplary minor components can include without limitation copper, aluminum, nickel, silver, germanium, indium, zinc, and the like, and combinations thereof. According to one embodiment, the main component can include tin for an environmentally-friendly material.

The low-melting point metal may have a solidus temperature (temperature at which solidification is complete) that is lower than the melt processing temperature (melting point) of the thermoplastic polymer resin of the composite material. When the low-melting point metal has a solidus temperature that is lower by more than 20° C. than the melt processing temperature of the thermoplastic polymer resin of the composite material, it can be beneficial for the process of manufacturing a composite material. In another embodiment, the low-melting point metal may have a solidus temperature that is higher by more than about 100° C. than the environment in which the composite material is used.

A more detailed description follows. In order for the low-melting point metal to form a network in the thermoplastic polymer resin during manufacturing of the EMI/RFI shielding resin composite material, the solidus temperature and the liquidus temperature of the low-melting point metal that affect the dispersion have the following order: liquidus temperature>melting point of thermoplastic polymer resin>solidus temperature.

Such solidus temperature may be controlled by the amount ratio of the main component and the minor component of the low-melting point metal. Thereby, it is possible to control the physical properties such as liquidus temperature (temperature at the beginning of solidification) and mechanical strength.

In one embodiment, when aluminum is used as the electrically conductive filler, the solid solution can include aluminum; similarly, when the electrically conductive filler is copper, the solid solution can include copper.

One method of controlling the solidus temperature of the low-melting point metal by adjusting the amount of the main component and the minor component includes providing a solid solution with another metal. A non-limiting example of the method includes controlling the solidus temperature of tin/copper (97/3 weight ratio) to 227° C., or the solidus temperature of tin/copper/silver (92/6/2 weight ratio) to 217° C.

The EMI/RFI shielding resin composite material may include the low-melting point metal in an amount of about 1 to about 10 volume %, and in another embodiment about 2 to about 5 volume %, based on the total amount of EMI/RFI shielding resin composite material. When the EMI/RFI shielding resin composite material includes the low-melting point metal in an amount within these ranges, it is possible to form electrically conductive filler networks.

(D) Glass Fiber Filler

In exemplary embodiments, the EMI/RFI shielding resin composite material may further optionally include a glass fiber filler to improve the strength.

The glass fiber filler may have a diameter of about 8 to about 13 μm and a length of about 2 to about 5 mm, but is not limited thereto. Use of a glass fiber filler with a diameter and length within these ranges can reinforce the composite material and improve the process of making the composite material.

The EMI/RFI shielding resin composite material may include the glass fiber filler in an amount of about 50 parts by weight or lower, and in another embodiment, about 2 to about 50 parts by weight, based on about 100 parts by weight of the EMI/RFI shielding resin composite material. When the EMI/RFI shielding resin composite material includes the glass fiber filler in an amount within these ranges, it is possible to improve the strength of the EMI/RFI shielding resin composite material.

(E) Other Additives

The EMI/RFI shielding resin composite material according to one embodiment may further optionally include a variety of known additives, as required, such as an antioxidant, an ultraviolet (UV) absorber, a flame retardant, a lubricant, a dye and/or pigment, and so on, as long as they do not damage the effects of the invention. The skilled artisan will understand the types and amounts of additives and how to use additives in the present invention without undue experimentation. The EMI/RFI shielding resin composite material may include the additives in an amount of about 0 to about 60 parts by weight, and in another embodiment, about 1 to about 30 parts by weight, based on about 100 parts by weight of the EMI/RFI shielding resin composite material.

Another embodiment of the present invention provides a molded product made using the EMI/RFI shielding resin composite material. The molded product is applicable in fields requiring an EMI/RFI shield, and is particularly applicable for a display device such as a TV and a PDP, and an electro-electronic device such as a computer, a mobile phone, and an office automation device.

EXAMPLES

The following examples illustrate the present invention in more detail. However, they are exemplary embodiments of the present invention and are not limiting. A person having ordinary skill in this art can sufficiently understand parts of the present invention that are not specifically described.

(A) Thermoplastic Polymer Resin

The thermoplastic polymer resin is polyphenylene sulfide (PPS). Ryton PR-35 manufactured by Chevron Phillips Chemical Co. is used for the PPS resin, and it has a zero shear viscosity of 1000[P] measured at 315.5° C. under a nitrogen atmosphere.

(B) Electrically Conductive Filler Having a Polyhedral Shape or Being Capable of Forming a Polyhedral Shape Needle-shaped copper formed through a polishing process to have a diameter of 40 μm and a length of 2.5 to 3 mm, sheet-shaped aluminum having an average thickness of 350 nm along with needle-shaped aluminum, and sheet-shaped copper having an average thickness of 500 nm are used as electrically conductive filler having a polyhedral shape or being capable of forming a polyhedral shape. The shear strength of the aluminum is 30 MPa, and the shear strength of the copper is 42 MPa.

(C) Low-Melting Point Metal

A tin/aluminum low-melting point metal and a tin/copper low-melting point metal containing tin as a primary component are used as the low-melting point metal. In the case of the tin/aluminum low-melting point metal, a tin/aluminum solid solution with a mixing ratio of tin and aluminum of 99.7 wt % and 0.3 wt %, respectively, and a solidus temperature of 228° C., is used. In the case of the tin/copper low-melting point metal, a tin/copper solid solution with a mixing ratio of tin and copper of 96 wt % and 4 wt %, respectively, and a solidus temperature of 227° C., is used.

(D) Glass Fiber Filler

The glass fiber filler is ECS 03 T-717PL (manufactured by Nippon Electric Glass) having a diameter of 13 μm and a length of 3 mm and coated with silanes on its surface to improve the interface adherence with the thermoplastic polymer resin of PPS.

An EMI/RFI shielding resin composite material is made using the above components in the compositions of Examples 1 to 5 and Comparative Example 1 shown in the following Table 1 and Comparative Examples 2 and 3 shown in the following Table 2 and each composition is extruded using a conventional twin screw extruder and an injector to provide pellets. As shown in the following Table 1, if the amount of glass fiber filler is recalculated into parts by weight, it would be 6.4 parts by weight based on the total of 100 parts by weight of the EMI/RFI shielding resin composite material.

Also, as shown in the following Table 2, samples of Comparative Example 3 are fabricated by injection-molding PPS in a sheet shape, and performing a typical plating process, which includes removal of grease, etching, neutralization, activation, deposition, activation, and plating process, and plating both sides of a sheet-shaped sample with Cu and Ni.

Figure 2:
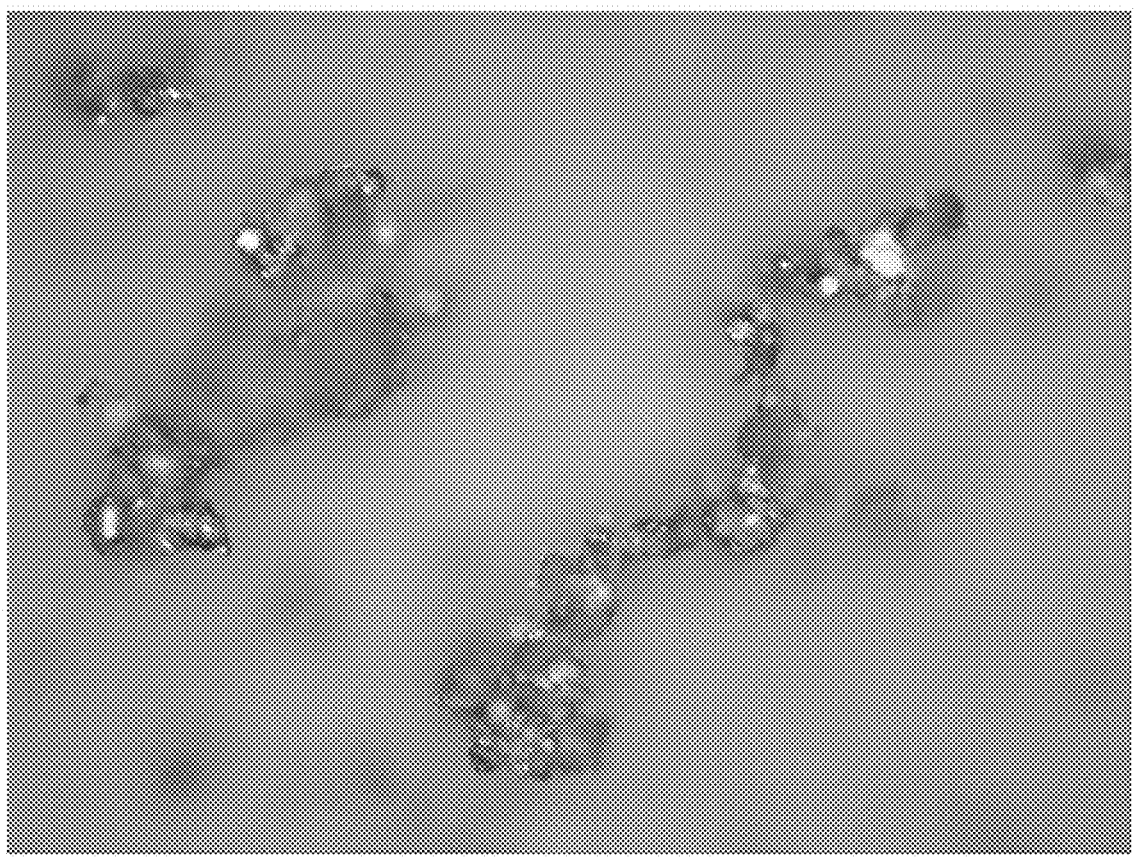
FIG. 2 is an optical microscopic photograph showing the shape of a needle-shaped aluminum electrically conductive filler existing in the EMI/RFI shielding resin composite material fabricated in accordance with Example 5 exemplifying of an embodiment of the present invention.
Figure 3:
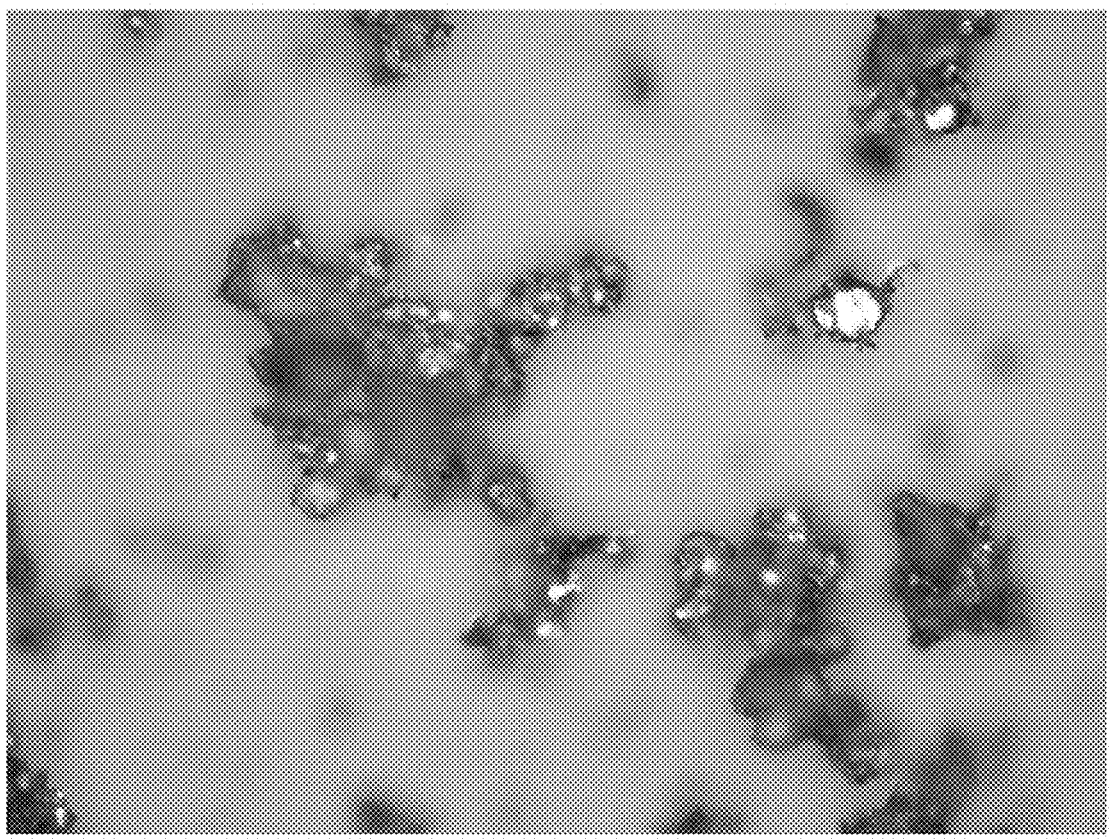
FIG. 3 is an optical microscopic photograph showing the shape of a sheet-shaped aluminum electrically conductive filler existing in the EMI/RFI shielding resin composite material fabricated in accordance with Example 5 exemplifying of an embodiment of the present invention.

The state of the electrically conductive filler in the EMI/RFI shielding resin composite material fabricated according to Example 5 is presented in FIGS. 1 to 3.

FIG. 1 is an optical microscopic photograph showing the state of an aluminum electrically conductive filler and a low-melting point metal existing in an EMI/RFI shielding resin composite material fabricated according to Example 5. It can be seen from FIG. 1 that polyhedral-shaped aluminum connects the low-melting point metal.

FIG. 2 is an optical microscopic photograph showing the state of a needle-shaped aluminum electrically conductive filler existing in the EMI/RFI shielding resin composite material fabricated according to Example 5. FIG. 2 shows the state of the needle-shaped aluminum forming a polyhedral shape.

FIG. 3 is an optical microscopic photograph showing the state of a sheet-shaped aluminum electrically conductive filler existing in the EMI/RFI shielding resin composite material fabricated according to Example 5. FIG. 3 shows the state of the sheet-shaped aluminum forming a polyhedral shape.

Also, samples having a thickness of 2.1T are fabricated by injection-molding the fabricated pellets with a conventional injection molder, and the electromagnetic wave shielding efficiencies of the samples are measured based on the ASTM D4935 method. The measurement results are shown in the following Tables 1 and 2.

TABLE 1

| (volume %) | Example 1 | Example 2 | Example 3 | Example 4 | Example 5 | Comparative Example 1 |
|---|---|---|---|---|---|---|
| PPS | 60 | 60 | 60 | 60 | 60 | 60 |
| Needle-shaped aluminum | 38 | — | 29 | — | 26 | — |
| Needle-shaped copper | — | 38 | — | 29 | — | 40 |
| Sheet-shaped aluminum | — | — | 9 | — | 7 | — |
| Sheet-shaped copper | — | — | — | 9 | — | — |
| Sn/Al low-melting point metal | 2 | — | 2 | — | 2 | — |
| Sn/Cu low-melting point metal | — | 2 | — | 2 | — | — |
| glass fiber filler | — | — | — | — | 5 | — |
| Shielding effect [dB] at 2.1 T | 49.6-92.2 | 54.7-92.1 | 48.8-108.3 | 51.5-106.1 | 42.3-110.2 | 55.5-91.8 |
| Average shielding effect [dB] at 2.1 T | 70.6 | 68.3 | 83.0 | 80.3 | 85.7 | 62.8 |

TABLE 2

| Volume % | Comparative Example 2 | Comparative Example 3 |
|---|---|---|
| PPS | 60 | 60 |
| Carbon fiber[2] | 40 | — |
| Needle-shaped stainless steel[1] | — | 40 |
| Shielding effect[dB] at 2.1 T | 11.0-24.7 | 33.0-85.0 |
| Average shielding effect [dB] at 2.1 T | 19.5 | 55.0 |

[1] Needle-shaped stainless steel fabricated to have a diameter of 10 μm and a length of 200 μm by a cutting process
[2] Pitch-based carbon fiber having a diameter of 11 μm and a length of 6 mm In Tables 1 and 2, the shielding effect is considered excellent when the average shielding effect result is high. As shown in Tables 1 and 2, when the samples have the same thickness, the EMI/RFI shielding resin composite material of Examples 1 to 5 exhibits superior electromagnetic wave shielding effects as compared to Comparative Examples 1 to 3. Particularly, the EMI/RFI shielding resin composite material of Comparative Example 1, which did not include a low-melting point metal, exhibits inferior shielding effects as compared to Examples 1 to 5. Also, the EMI/RFI shielding resin composite material of Comparative Example 3, which includes needle-shaped stainless steel having a smooth surface and does not significantly form a polyhedral shape during the process, exhibits deteriorated shielding effects as compared to Examples 1 to 5. It can be seen from the results that the electromagnetic wave shielding effect is improved when an electrically conductive filler having a polyhedral shape and a low-melting point metal are used together.

Particularly, it can be seen from the results of Example 5 that although a glass fiber filler is added to reinforce the physical properties, the addition of the glass fiber increased the viscosity of the basic resin. The increased viscosity promotes the melting tension/dispersion of a low-melting point metal to thereby activate the networking of the filler, and at the same time the increased viscosity raises the shear stress applied to a metal filler and thereby induces increased polishing/pulverization action, which leads to an increase in the electromagnetic wave shielding effect.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. An electromagnetic wave interference (EMI)/radio frequency interference (RFI) shielding resin composite material, comprising:
    (A) a thermoplastic polymer resin;
    (B) about 20 to about 69 volume % of an electrically conductive filler having a polyhedral shape or being capable of forming a polyhedral shape;
    (C) a low-melting point metal including a primary component comprising tin, bismuth, lead, or a combination thereof, and a secondary component comprising copper, aluminum, nickel, silver, germanium, indium, zinc, or a combination thereof; and
    (D) a glass fiber filler.

2. The EMI/RFI shielding resin composite material of claim 1, wherein the EMI/RFI shielding resin composite material comprises:
    about 30 to about 85 volume % of the thermoplastic polymer resin (A);
    about 1 to about 10 volume % of the low-melting point metal (C).

3. The EMI/RFI shielding resin composite material of claim 1, comprising the glass fiber filler (D) in an amount of about 50 parts by weight or less based on about 100 parts by weight of the EMI/RFI shielding resin composite material.

4. The EMI/RFI shielding resin composite material of claim 1, wherein the thermoplastic polymer resin (A) comprises a polyamide, a polyalkylene terephthalate, a polyacetal, a polycarbonate, a polyimide, a polyphenylene oxide, a polysulfone, a polyphenylene sulfide, a polyamide imide, a polyether sulfone, a liquid crystal polymer, a polyetherketone, a polyetherimide, a polyolefin, acrylonitrile-butadiene-styrene, a polystyrene, a syndiotactic polystyrene, or a combination or blend thereof.

5. The EMI/RFI shielding resin composite material of claim 1, wherein the electrically conductive filler having a polyhedral shape or being capable of forming a polyhedral shape (B) comprises a needle-shaped electrically conductive filler having a polyhedral interior, a sheet-shaped electrically conductive filler having a polyhedral interior, a globular electrically conductive filler having a polyhedral interior, or a combination thereof.

6. The EMI/RFI shielding resin composite material of claim 5, wherein the needle-shaped electrically conductive filler having a polyhedral interior is a metal filler fabricated in a needle shape by pressing and cutting a dendrite metal filler fabricated through an electrolysis process or a porous metal filler fabricated through a thermal process, or a needle-shaped metal filler fabricated by polishing a metal lump;
    the sheet-shaped electrically conductive filler having a polyhedral interior is a metal filler fabricated in a sheet shape by pressing a dendrite metal filler fabricated through an electrolysis process or a porous metal filler fabricated through a thermal process, or a sheet-shaped metal filler fabricated through a pulverization process; and the globular electrically conductive filler having a polyhedral interior is a globular metal filler fabricated through a melt injection process.

7. The EMI/RFI shielding resin composite material of claim 1, wherein the electrically conductive filler (B) is broken down or pulverized by a shear stress applied during a process of making the EMI/RFI shielding resin composite material to thereby form a polyhedral shape.

8. The EMI/RFI shielding resin composite material of claim 7, wherein the electrically conductive filler (B) has a shear strength of under about 300 MPa.

9. The EMI/RFI shielding resin composite material of claim 1, wherein the electrically conductive filler (B) comprises aluminum, copper, magnesium, iron, nickel, molybdenum, zinc, silver, alloys thereof or a combination thereof.

10. The EMI/RFI shielding resin composite material of claim 1, wherein the low-melting point metal (C) is a solid solution including two or more kinds of metal elements.

11. The EMI/RFI shielding resin composite material of claim 1, wherein the low-melting point metal (C) has a solidus temperature that is lower than a temperature of a process of making the EMI/RFI shielding resin composite material.

12. A molded product made using the EMI/RFI shielding resin composite material according to claim 1.

13. An electromagnetic wave interference (EMI)/radio frequency interference (RFI) shielding resin composite material, comprising:
 (A) a thermoplastic polymer resin;
 (B) about 20 to about 69 volume % of an electrically conductive filler having a polyhedral shape or being capable of forming a polyhedral shape;
 (C) a low-melting point metal having a solidus temperature that is lower than a temperature of a process of making the EMI/RFI shielding resin composite material; and
 (D) a glass fiber filler.

* * * * *